(12) United States Patent
Iorga

(10) Patent No.: US 9,310,432 B2
(45) Date of Patent: Apr. 12, 2016

(54) METHOD AND SYSTEM FOR MEASURING THE IMPEDANCE OF THE POWER DISTRIBUTION NETWORK IN PROGRAMMABLE LOGIC DEVICE APPLICATIONS

(76) Inventor: Cosmin Iorga, Newbury Park, CA (US)

( * ) Notice: Subject to any disclaimer, the term of this patent is extended or adjusted under 35 U.S.C. 154(b) by 756 days.

(21) Appl. No.: 13/465,024

(22) Filed: May 6, 2012

(65) Prior Publication Data

US 2013/0030741 A1  Jan. 31, 2013

Related U.S. Application Data

(60) Provisional application No. 61/511,547, filed on Jul. 25, 2011.

(51) Int. Cl.
*G01R 27/00* (2006.01)
*G01R 31/317* (2006.01)
*G01R 31/3185* (2006.01)

(52) U.S. Cl.
CPC .. *G01R 31/31721* (2013.01); *G01R 31/318519* (2013.01)

(58) Field of Classification Search
CPC .................. G01R 31/31721; G01R 31/318519
USPC ............................................................ 702/65
See application file for complete search history.

(56) References Cited

U.S. PATENT DOCUMENTS

| | | | |
|---|---|---|---|
| 6,385,565 B1 * | 5/2002 | Anderson et al. | 703/18 |
| 2003/0164695 A1 * | 9/2003 | Fasshauer et al. | 324/76.21 |
| 2004/0095111 A1 * | 5/2004 | Kernahan | 323/282 |
| 2005/0057315 A1 * | 3/2005 | Groen et al. | 331/57 |

* cited by examiner

*Primary Examiner* — Sujoy Kundu
*Assistant Examiner* — Ricky Ngon

(57) ABSTRACT

On-die measurement of power distribution impedance frequency profile of a programmable logic device (PLD), such as field programmable gate array (FPGA) or complex programmable logic device (CPLD), is performed by configuring and using only logic blocks resources commonly available in any existing programmable logic device, without the need of built-in dedicated circuits. All measurements are done inside the programmable logic device without the need of external instruments. The measurement method can be used during characterization to select decoupling capacitors or for troubleshooting existing systems, after which the programmable logic device may be reconfigured to perform any other user-defined function.

15 Claims, 11 Drawing Sheets

METHOD AND SYSTEM FOR MEASURING THE IMPEDANCE OF THE POWER DISTRIBUTION NETWORK IN PROGRAMMABLE LOGIC DEVICE APPLICATIONS

CROSS-REFERENCE TO RELATED APPLICATIONS

This application claims the benefit of U.S. Provisional Patent application Ser. No. 61/511,547 entitled "SYSTEM AND METHOD FOR CONFIGURING A PROGRAMMABLE LOGIC DEVICE INTEGRATED CIRCUIT TO MEASURE ON-DIE THE ELECTRICAL IMPEDANCE OF ITS POWER DISTRIBUTION NETWORK CIRCUIT" which was filed Jul. 25, 2011. The entirety of the aforementioned application is herein incorporated by reference.

FIELD OF THE INVENTION

This invention relates to programmable logic devices integrated circuits, and more particularly to measuring the power distribution impedance of a programmable logic device connected to a power distribution network circuit.

BACKGROUND OF THE INVENTION

Programmable logic devices (PLD) such as field programmable gate arrays (FPGA) and complex programmable logic devices (CPLD), are integrated circuits that can be programmed by users to perform customized logic functions. In a typical design process a user defines customized logic functions using a computer aided design software tool, such as schematic capture or hardware description language (HDL). The software tool then implements the design for a specified programmable logic device type using configurable logic block resources available on that device. The implemented design is stored in a configuration data file. This data file is then loaded into a programmable logic device, configuring the programmable logic device to perform the user's defined customized logic functions.

A programmable logic device is typically mounted on a printed circuit board (PCB) as part of an electronic system. At least one voltage regulator device mounted on the printed circuit board, or external to the printed circuit board, provides power supply to the programmable logic device. The electric circuit comprising the voltage regulator, the interconnects from the voltage regulator to the on-die circuits of the programmable logic device, and any decoupling capacitors is called power distribution network (PDN).

Typical programmable logic device dies are fabricated in complementary metal-oxide-semiconductor (CMOS) process. In digital circuits fabricated in CMOS process when a signal transitions from a logic state "false" to a logic state "true" a transient electric current flows from the positive node of the power supply into the digital circuit. Similarly when a signal transitions from a logic state "true" to a logic state "false" a transient electric current flows from the digital circuit into the negative node of the power supply. These transient currents flow through the power distribution network and generate transient voltage drops on the electrical impedance of the power distribution components through which these transient currents flow. As a direct consequence of the transient voltage drops, the on-die positive voltage supply drops momentarily and the on-die negative voltage supply rises momentarily. The on-die circuits see these momentary supply voltage drops and rises as power supply noise. This noise is called switching noise because the switching of signal logic states in the digital circuit generates it.

In a typical programmable logic device multiple signals may switch at the same moment in time increasing the magnitude of switching noise on the positive and negative supplies. This effect is commonly refereed to as simultaneous switching noise (SSN). Simultaneous switching noise (SSN) degrade the performance of the programmable logic device circuits. The magnitude of the simultaneous switching noise (SSN) depends on the number of switching gates of the programmable logic device, the switching speed, and the electrical impedance of the power distribution network (PDN).

In general, the power distribution network impedance is a complex quantity having the magnitude dependent on frequency. As a direct consequence, the magnitude of simultaneous switching noise depends on the frequency of operation of the programmable logic device. Most power distribution networks present impedance magnitude peaks at some frequencies, called resonance peaks. If operating frequency of the programmable logic device, or harmonics of the operating frequency, overlap with a resonance peak of the power distribution network, then significant noise is generated on the on-die voltage supplies.

Knowing the frequency characteristics of the power distribution impedance can help reduce the simultaneously switching noise by configuring the programmable logic device to operate at frequencies that do not overlap with the resonance peak frequencies. Alternately, designers can modify the power distribution network circuit so that the resonance peaks do not overlap with operating frequencies or their harmonics, which is typically done through adjusting the values of decoupling capacitors.

It is therefore desirable to know the frequency characteristic of the power distribution impedance. Most of the existing techniques measure only the section of the power distribution impedance of the printed circuit board, and do not address the sections in the interface to the package, in the package, in the interface to the die, and in the die. While measurements of the printed circuit board can be very accurate, many times the resonance peak frequencies change when the package with die is attached to the board. Therefore, on-die measurement techniques can provide more accurate results. Typical on-die measurement techniques use built-in dedicated circuits that measure the power distribution network impedance. These built-in measurement circuits have to be implemented during the fabrication of integrated circuits, and most of the programmable logic devices (PLD) available on the market do not have such built-in measurement capabilities.

It would therefore be desirable to be able to measure on-die the electrical impedance of the power distribution network of a programmable logic device (PLD) by using only general configurable logic blocks available in any programmable logic device (PLD), without the need of built-in dedicated circuits.

BRIEF SUMMARY OF THE INVENTION

This invention provides a system and method for measuring the electrical impedance of the power distribution network of a programmable logic device (PLD) by configuring and using only general configurable logic blocks and/or input-output blocks resources commonly available in any existing programmable logic device. All measurements are done inside the programmable logic device without the need of external instruments.

The main advantage of using resources that are not specifically built-in for power distribution measurements is that this invention can be used with most of the existing programmable logic devices (PLD) available on the market, including field programmable gate arrays (FPGA) and complex programmable logic devices (CPLD).

Another advantage of using resources that are not specifically built-in for power distribution measurements is that this invention can be implemented in a programmable logic device temporarily only for characterization or troubleshooting purposes, after which the programmable logic device can be reconfigured to perform any other user defined logic functions. This way, after characterization or troubleshooting, the programmable logic device resources used for power distribution impedance measurements are freed up and re-configured to perform other logic functions, saving cost and reducing power consumption.

A third advantage of using only internal resources of the programmable logic device is that this invention can be used to remotely troubleshoot existing electronic systems that use programmable logic devices and operate in hardly accessible locations, like for example data communication equipment installed in the field. For example a common failure mechanism in electronic systems is internal shorting of tantalum electrolytic capacitors, which burns internal fuses built-in inside tantalum electrolytic capacitors. As a direct consequence, a burned capacitor becomes an open circuit and does not perform the intended power distribution decoupling function. Typical power distribution networks comprise multiple tantalum decoupling capacitors connected in parallel, and if some of them burn their internal fuses, the impedance of the power distribution increase. One way to detect an increase of power distribution impedance is to measure it; however, most existing techniques require major disruption of the electronic system to get access to measurement nodes and connect measurement instruments. The present invention allows more convenient troubleshooting by remotely accessing the programmable logic device and measuring the power distribution impedance using only internal configurable logic blocks resources commonly available in any programmable logic device. After troubleshooting, the programmable logic device can be reconfigured remotely back to the original functionality.

In one embodiment of the present invention, part of the programmable logic device (PLD) internal logic blocks are configured as a current load that consumes a continuously sinusoidal current from an on-die power supply voltage. This sinusoidal current load has programmable frequency and an activate/deactivate feature. When the current load is activated, the sinusoidal current flows through the power distribution network impedance and generates a sinusoidal variation of the on-die power supply voltage. Another group of configurable logic blocks in the programmable logic device (PLD) is configured to form a positive feedback ring oscillator, which is powered from the same on-die voltage supply as the sinusoidal current load. The sinusoidal variation of the voltage supply modulates the frequency of the ring oscillator. A frequency counter, configured also from internal configurable logic blocks of the programmable logic device (PLD), measures a first frequency representing the steady-state average frequency of the frequency-modulated ring oscillator signal over a period of time. Then, with the sinusoidal power supply current load not active, the frequency counter measures a second frequency representing the steady-state non-modulated frequency of the ring oscillator signal. The electrical impedance of the power distribution network is then calculated using a mathematical formula involving the measured values of the first frequency, the second frequency, and a plurality of fabrication characteristics and functional specifications of the programmable logic device. By repeating the electrical impedance measurement for multiple frequencies of the sinusoidal current load, a frequency characteristic (frequency profile) of the power distribution impedance can be calculated.

Other features and advantages of the present invention will become apparent to one skilled in the art from examination of the accompanying drawings and detail description.

DETAILED DESCRIPTION OF THE INVENTION

The description presented herein will focus on a system and method implemented in a programmable logic device (PLD) and more specifically in a field programmable gate array (FPGA); however, it is significant to note that the enclosed embodiments are not to be considered as limiting. Those skilled in the art will appreciate that the concepts and embodiments of the present invention may be applied to various types of programmable devices and integrated circuits.

Figure 1:
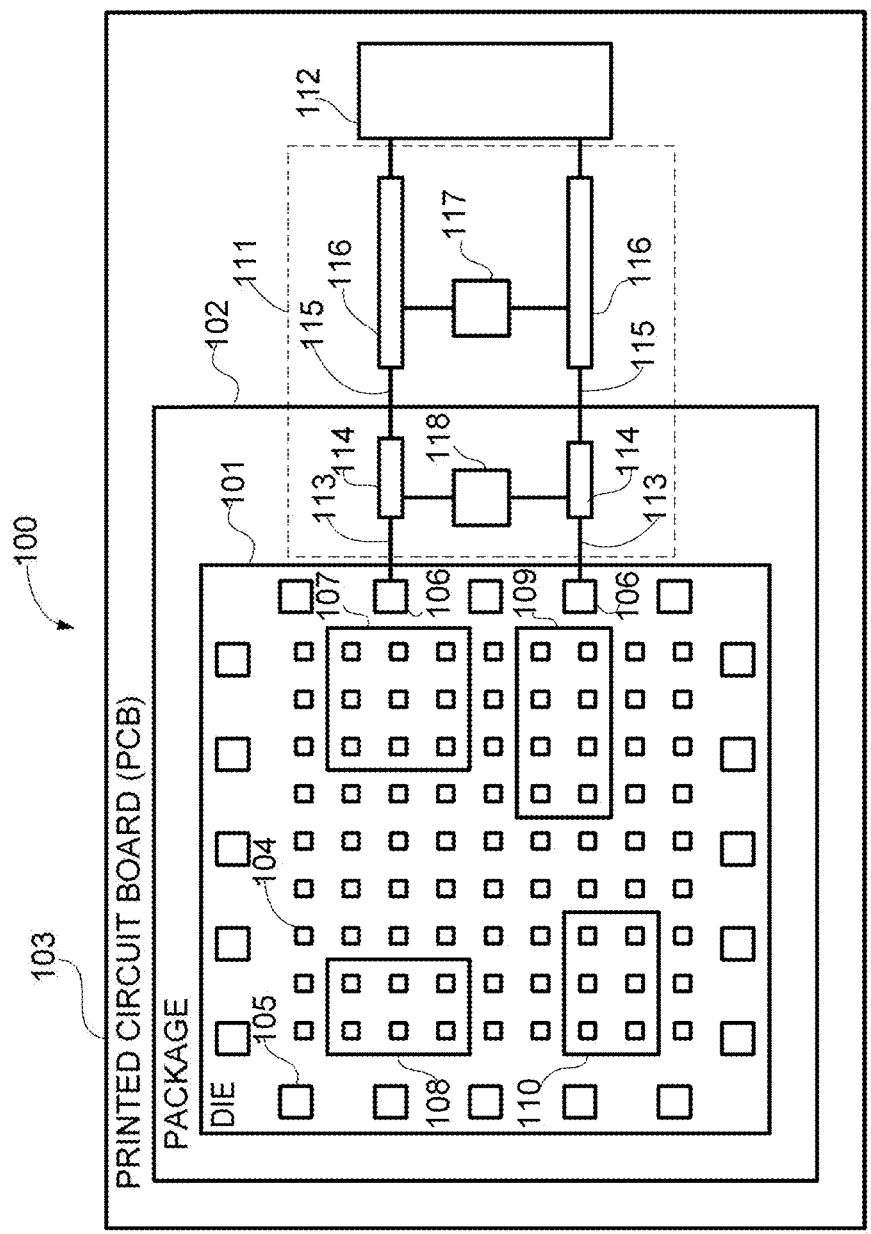
FIG. 1 is a structural diagram of an illustrative programmable logic device integrated circuit connected to a power distribution network and configured to measure the electrical impedance of the power distribution network in accordance with the present invention.

Turning now to the drawing representing the current invention, FIG. 1 illustrates a structural diagram, generally designated 100, of a programmable logic device die 101 connected to a power distribution network 111 and configured to measure the electrical impedance of the power distribution network according to an embodiment of the present invention.

Programmable logic device die 101 has been mounted in package 102. The package 102 has been mounted on printed circuit board 103. Programmable logic device die 101 contains a plurality of configurable logic blocks (CLB) 104 and input-output blocks 105 and 106. Configurable logic blocks 104 can be configured to perform customized logic functions. Some input-output blocks 105 can be configured to transmit or receive signals and some input-output blocks 106 are assigned as power supply pins that provide voltage supplies to the programmable logic device die 101. Configurable logic blocks (CLB) may contain one or more look-up-table (LUT) configurable combinational logic blocks, intentionally not shown in this figure for simplicity.

It is significant to notice that in the description presented herein the use of terms "configurable logic blocks" for internal logic functions blocks of a programmable logic device, look-up-tables (LUT) for configurable combinational logic blocks, and "input-output blocks" for interface blocks of a programmable logic device is not to be considered limiting. Different manufacturers my use different names for "configurable logic blocks", "look-up-tables", and "input-output blocks"; however, those skilled in the art will appreciate that other names used are conceptually equivalent to configurable logic blocks, look-up-tables, and input-output blocks, used in the description herein.

Programmable logic device die 101 has some configurable logic blocks (CLB) configured to function as a "sinusoidal power supply current load" 107, some configurable logic blocks (CLB) configured to function as a "ring oscillator" 108, some configurable logic blocks (CLB) configured to function as a "frequency generator" 109, and some configurable logic blocks (CLB) configured to function as a "frequency counter" 110. The ring oscillator and sinusoidal power supply current load may contain configurable logic blocks and/or input-output logic blocks. Additional functional blocks and signals specific to programmable logic devices including but not limited to control of internal functional blocks and communication with an external computer or electronic system have been intentionally omitted from this figure for simplicity; however, their existence becomes apparent to one skilled in the art.

Typical programmable logic devices require multiple power supply voltage sources; however, for simplicity FIG. 1 shows only one power supply voltage source 112. Programmable logic device die 101 has power supply pins 106 electrically connected through electric network 111 to voltage source 112 mounted on printed circuit board 103. The electric network 111 includes electrical interfaces 113 between die and package, electrical interconnects 114 on package, electrical interfaces 115 between package and printed circuit board, electrical interconnects 116 on printed circuit board to voltage source 112, decoupling capacitors 117 on printed circuit board, and decoupling capacitors 118 on package. Voltage source 112 may include a linear voltage regulator, a switching voltage regulator, a battery, or any type of voltage source device.

Figure 2:
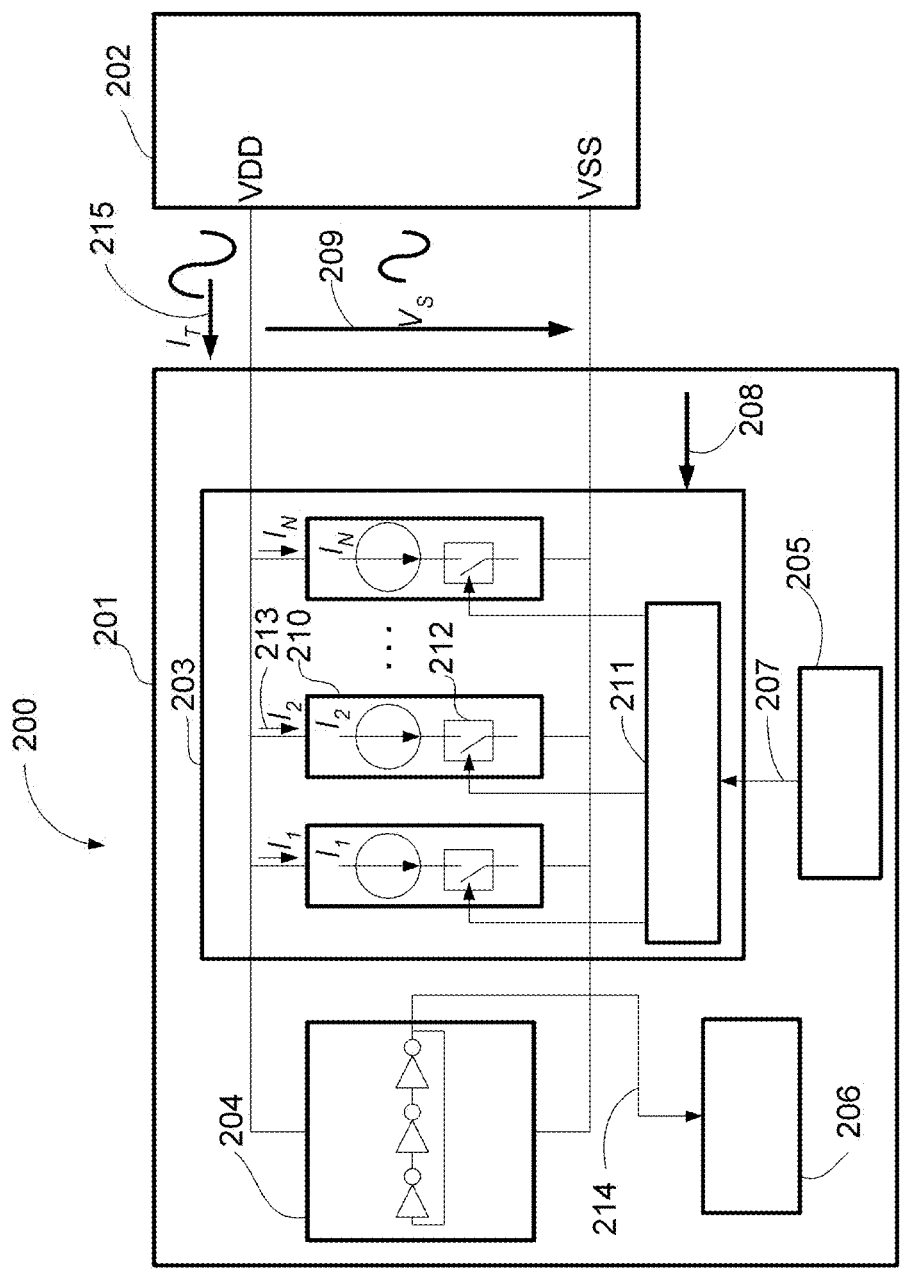
FIG. 2 is a functional diagram of an illustrative programmable logic device integrated circuit connected to a power distribution network and configured to measure the electrical impedance of the power distribution network in accordance with the present invention.

Turning now to FIG. 2, which illustrates a functional diagram, generally designated 200, of the embodiment shown in FIG. 1, a programmable logic die 201 is electrically connected to a power distribution network 202. The power distribution network 202 represents the power supply electrical connection 111 of FIG. 1 and the voltage supply 112 of FIG. 1. Typical power distribution networks consist of multiple circuit loops containing resistive, capacitive, and inductive components. As a direct consequence, the total impedance of the power distribution network is a mathematical complex number having the magnitude and phase dependent on frequency.

Programmable logic device die 201 has configurable logic blocks (CLB) configured to function as "sinusoidal power supply current load" 203, "ring oscillator" 204, "frequency generator" 205, and "frequency counter" 206.

Frequency generator 205 provides a digital signal with programmable frequency to the sinusoidal power supply current load block 203 through an electrical connection 207. Sinusoidal power supply current load 203 has an activate feature 208. When sinusoidal power supply current load 203 is activated, a sinusoidal current 215 flows through the power distribution network 202 and generates a sinusoidal variation of the power supply voltage 209.

Sinusoidal power supply current load 203 comprises a plurality of power supply constant current loads 210 and a trigonometric sine function decoder 211. Each power supply constant current load has an activate feature 212. When activated, a power supply constant current load consumes a continuous constant current from the power distribution network 202.

Trigonometric sine function decoder 211 receives a periodic digital signal from frequency generator 205 through an electrical connection 207. Trigonometric sine function decoder 211 activates periodically a number of power supply constant current loads 210 so that the combined power supply current gradually increases and decreases following a trigonometric sine or cosine function with a frequency proportional to the frequency of the digital signal received from the function generator. The granularity of the generated power supply sinusoidal current depends on the number of power supply current loads and magnitude of the current generated by each power supply current load. To generate a higher resolution sinusoidal current load a larger number of power supply current loads is needed.

In one embodiment a trigonometric sine function decoder 211 can be implemented as a mathematical table of sine or cosine functions values stored in a memory block of a programmable logic device. These sine or cosine values may be read in a periodical sequence and may activate a proportional number of power supply constant current loads. The function generator may control the speed of reading the sine or cosine values from the memory block, therefore, controlling the frequency of the generated sinusoidal power supply current load.

In a different embodiment a trigonometric sine function decoder 211 can be implemented by programming configurable logic blocks to receive a digital signal from a frequency generator and to periodically activate variable numbers of power supply current loads, the said variable numbers proportionally following sine or cosine function values with frequency controlled by the frequency generator. One version of trigonometric sine function decoder may divide the period of the digital signal received from the frequency generator into a plurality of time intervals, and generate a plurality of activate signals during each of the said time intervals. Each activate signal may be connected to a different number of power supply constant current loads, the said numbers arranged in a sequence that reassembles a sine or cosine trigonometric function. Another version of trigonometric sine function decoder may count the pulses of the digital signal received from the frequency generator up to a preset limit value after which it may reset the counted value and start over from zero. This counting process may repeat periodically, and a plurality of activate signals may be generated, each activate signal corresponding one count step. Each of these activate signals may be connected to a different number of power supply constant current loads, the said numbers arranged in a sequence that reassembles a sine or cosine trigonometric function.

Figure 3A:
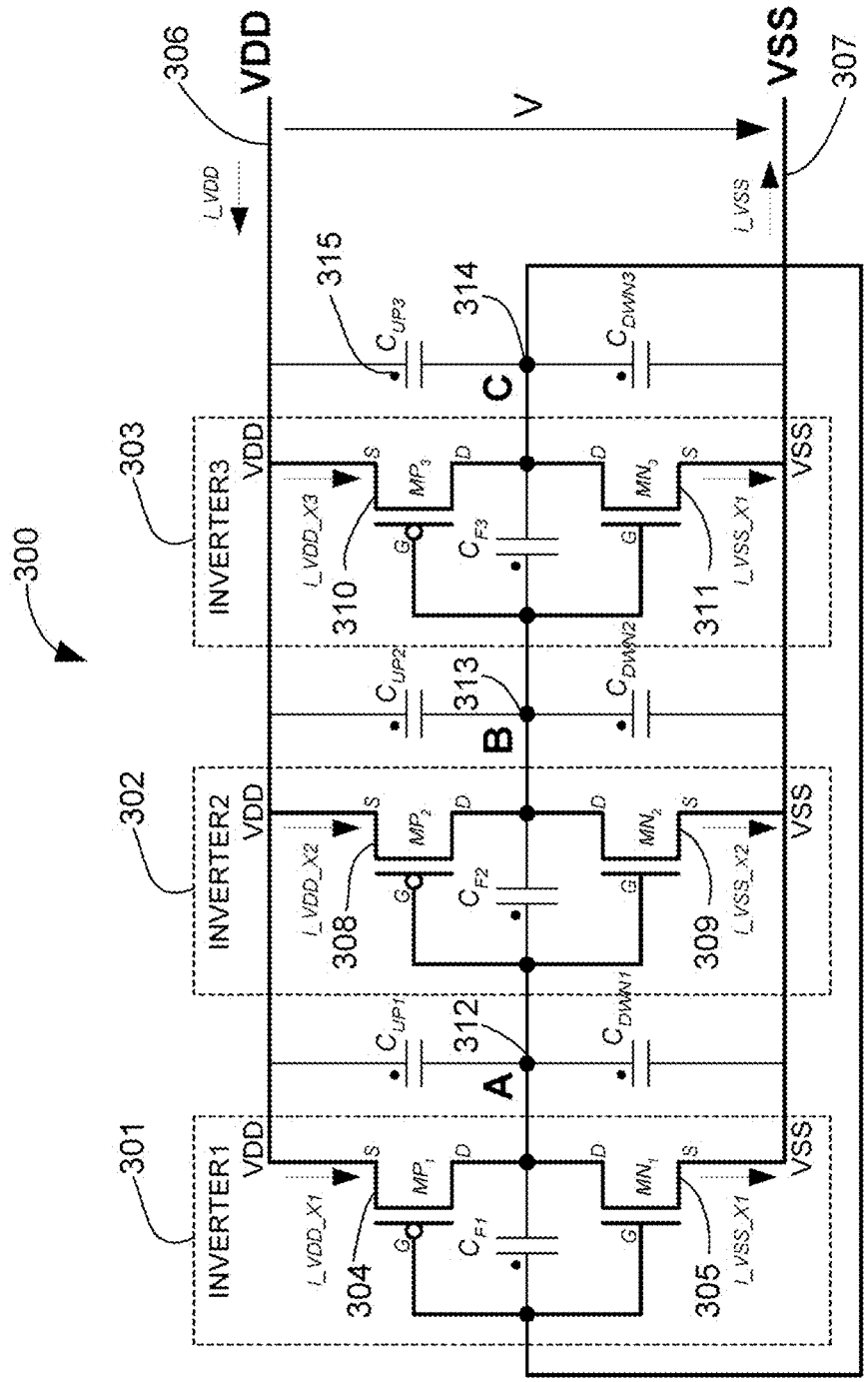
FIG. 3A illustrates a circuit and principle of creating a power supply constant current load using only CMOS digital logic gates.

FIG. 3A illustrates graphically through a schematic diagram, generally designated 300, the principle of creating a power supply constant current load using only complementary metal-oxide-semiconductor (CMOS) digital logic gates. This embodiment comprises three CMOS inverter digital logic circuits connected in a positive feedback ring oscillator circuit; however, it is significant to note that the types of CMOS digital logic gates and number of CMOS digital logic gates are not to be considered as limiting. Those skilled in the art will appreciate that the concepts and embodiments presented in FIG. 3A may be applied to various types and numbers of CMOS digital logic gates, such as INVERTERS, AND, NAND, OR, NOR, XOR, and combinations of them.

INVERTER1 301 logic gate comprises PMOS transistor $MP_1$ 304 and NMOS transistor $MN_1$ 305. The PMOS and NMOS transistors symbols used in FIG. 3A have the "source" terminal labeled "S", the "drain" terminal labeled "D", and the "gate" terminal labeled "G". The input of INVERTER1 consists of the gate terminals of transistors $MP_1$ and $MN_1$ electrically connected together. The output of INVERTER1 consists of the drain terminals of transistors $MP_1$ and $MN_1$ electrically connected together. The source terminal of PMOS transistor $MP_1$ is connected to the positive voltage supply node VDD 306, and the source terminal of NMOS transistor MN1 is connected to the negative voltage supply node VSS 307.

INVERTER2 302 logic gate comprises PMOS transistor $MP_2$ 308 and MNOS transistor $MN_2$ 309. The input of this inverter consists of the gate terminals of transistors $MP_2$ and $MN_2$ electrically connected together. The output of this inverter consists of the drain terminals of transistors $MP_2$ and $MN_2$ electrically connected together. The source terminal of PMOS transistor $MP_2$ is connected to the positive voltage supply node VDD 306, and the source terminal of NMOS transistor $MN_2$ is connected to the negative voltage supply node VSS 307.

INVERTER3 303 logic gate comprises PMOS transistor $MP_3$ 310 and MNOS transistor $MN_3$ 311. The input of this inverter consists of the gate terminals of transistors $MP_3$ and $MN_3$ electrically connected together. The output of this inverter consists of the drain terminals of transistors $MP_3$ and $MN_3$ electrically connected together. The source terminal of PMOS transistor $MP_3$ is connected to the positive voltage supply node VDD 306, and the source terminal of NMOS transistor $MN_3$ is connected to the negative voltage supply node VSS 307.

The output of INVERTER1 301 is electrically connected to the input of INVERTER2 302 through circuit node labeled "A" 312. The output of INVERTER2 302 is electrically connected to the input of INVERTER3 303 through circuit node labeled "B" 313. The output of INVERTER3 303 is electrically connected to the input of INVERTER1 301 through circuit node labeled "C" 314.

Represented with thin lines are the parasitic capacitances between circuit nodes A, B, C, VDD, and VSS. The parasitic capacitances are of two types: load capacitances and feedback capacitances. Load capacitances are formed between each of nodes A, B, C and power supply nodes VDD and VSS. With reference to FIG. 3, the load capacitances are represented by capacitors $C_{UP1}$, $C_{DWN1}$, $C_{UP2}$, $C_{DWN2}$, $C_{UP3}$, $C_{DWN3}$. Feedback capacitances are formed between nodes A, B, and C are represented by capacitors $C_{F1}$, $C_{F2}$, and $C_{F3}$.

$C_{UP1}$ represents primarily the sum of drain to substrate capacitance of transistor $MP_1$ 304 (the substrate of PMOS transistor in CMOS process is an N-Well implant biased from the positive voltage supply node VDD), gate to source capacitance of $MP_2$ 308 and metal to metal wire capacitance between node A 312 and power supply node VDD 306. $C_{DWN1}$ represents primarily the sum of drain to substrate capacitance of transistor $MN_1$ 305 (the substrate of NMOS transistors in CMOS process is biased from the negative voltage supply node VSS), gate to source capacitance of transistor $MN_2$ 309 and metal to metal wire capacitance between node A 312 and power supply node VSS 307.

$C_{UP2}$ represents primarily the sum of drain to substrate capacitance of transistor $MP_2$ 308, gate to source capacitance of transistor $MP_3$ 310, and metal to metal wire capacitance between node B 313 and power supply node VDD 306. $C_{DWN2}$ represents primarily the sum of drain to substrate capacitance of transistor $MN_2$ 309, gate to source capacitance of $MN_3$ 311, and metal to metal wire capacitance between node B 313 and power supply node VSS 307.

$C_{UP3}$ represents primarily the sum of drain to substrate capacitance of transistor $MP_3$ 310, gate to source capacitance of transistor $MP_1$ 304, and metal to metal wire capacitance between node C 314 and power supply node VDD 306. $C_{DWN3}$ represents primarily the sum of drain to substrate capacitance of transistor $MN_3$ 311, gate to source capacitance of transistor $MN_1$ 305, and metal to metal wire capacitance between node C 314 and power supply node VSS 307.

$C_{F1}$ represents primarily the sum of gate to drain capacitances of transistors $MP_1$ 304 and $MN_1$ 305 and metal to metal wire capacitance between node C 314 and node A 312. Similarly, $C_{F2}$ represents primarily the sum of gate to drain capacitances of transistors $MP_2$ 308 and $MN_2$ 309 and metal to metal wire capacitance between node A 312 and node B 313. $C_{F3}$ represents primarily the sum of gate to drain capacitances of transistors $MP_3$ 310 and $MN_3$ 311 and metal to metal wire capacitance between node B 313 and node C 314.

It becomes apparent to one skilled in the art that this circuit is a ring oscillator. Nodes A 312, B 313, and C 314 will oscillate with a frequency equal to the inverse of twice the propagation delay of a signal through these three inverters.

As the ring oscillator circuit oscillates, nodes A, B, and C change logic states switching between logic state "false" or "low", which corresponds to a voltage value equal to node VSS 307 voltage, and logic state "true" or "high", which corresponds to a voltage value equal to node VDD 306 voltage. As a direct consequence of logic states switching, capacitors $C_{UP1}$, $C_{DWN1}$, $C_{UP2}$, $C_{DWN2}$, $C_{UP3}$, $C_{DWN3}$, $C_{F1}$, $C_{F2}$, $C_{F3}$, are dynamically charged and discharged by electric currents flowing in and out of VDD power supply node and in and out of VSS power supply node.

Figure 3B:
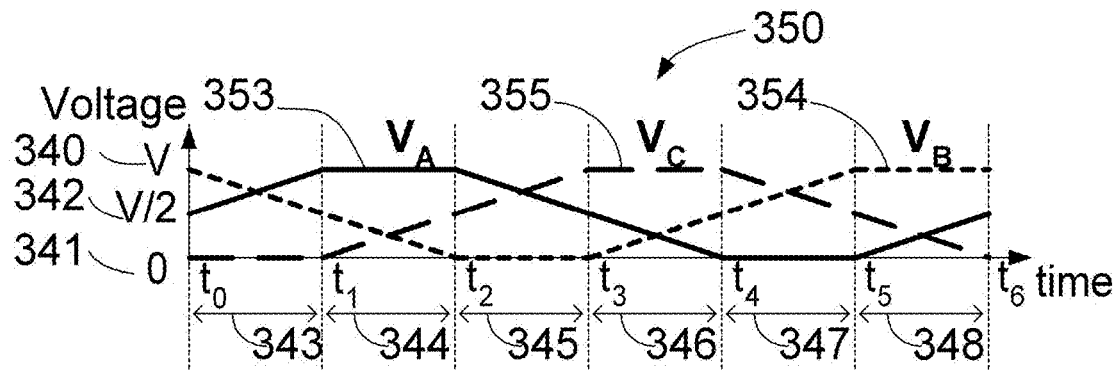
FIG. 3B shows simplified analysis waveforms of the circuit of FIG. 3A.

FIG. 3B, illustrates a simplified waveform analysis, generally designated 350, of voltage oscillations at nodes A 312, B 313, and C 314 of FIG. 3A. The vertical axis represents voltage and the horizontal axis represents time. This simplified waveform analysis assumes that INVERTER1 301, INVERTER2 302, and INVERTER3 303 of FIG. 3A switch logic states ideally when their inputs cross a voltage threshold equal to half of the power supply voltage. The power supply voltage has a value V=V(VDD)−V(VSS). The logic "high" or "true" is marked in FIG. 3B with symbol "V" 340, the logic level "low" or "false" is marked with symbol "0" 341, and the switching threshold is marked with symbol "V/2" 342. The threshold voltage V/2 is equal to one half of the power supply voltage V.

In this simplified waveform analysis it is assumed that the rising and falling edges at inverters' inputs and outputs have ideal constant-slope waveforms. The waveform of node A 312 of FIG. 3A is represented in FIG. 3B by trace $V_A$ 353. The waveform of node B 313 of FIG. 3A is represented in FIG. 3B by trace $V_B$ 354. The waveform of node C 314 of FIG. 3A is represented in FIG. 3B by trace $V_C$ 355.

With reference to the horizontal axis of FIG. 3B, at time $t_0$ a rising edge of signal $V_A$ 353 crosses switching threshold 342, initiating a logic state transition of INVERTER2, illustrated by waveform $V_B$ 354 falling edge. At time $t_1$ $V_B$ falling edge crosses switching threshold 342, initiating a logic state transition of INVERTER3, illustrated by waveform $V_C$ 355 rising edge. At time $t_2$ waveform $V_C$ 355 rising edge crosses switching threshold 342, initiating a logic state transition of INVERTER1, illustrated by waveform $V_A$ falling edge. At time $t_3$ waveform $V_A$ falling edge crosses switching threshold 342, initiating a logic state transition of INVERTER2, illustrated by waveform $V_B$ rising edge. At time $t_4$ waveform $V_B$ rising edge crosses switching threshold 342, initiating a logic state transition of INVERTER3, illustrated by waveform $V_C$ falling edge. At time $t_5$ waveform $V_C$ falling edge crosses switching threshold 342, initiating a logic state transition of INVERTER1, illustrated by waveform $V_A$ rising edge. At time $t_6$ waveform $V_A$ rising edge crosses switching threshold 342, initiating a logic state transition of INVERTER2, and the waveform variations start to repeat as from time $t_0$. The time interval between $t_0$ and $t_6$ represents the oscillation period of the ring oscillator. This oscillation period is divided into six intervals: from $t_0$ to $t_1$ 343, from $t_1$ to $t_2$ 344, from $t_2$ to $t_3$ 345, from $t_3$ to $t_4$ 346, from $t_4$ to $t_5$ 347, and from $t_5$ to $t_6$ 348.

Figure 3C:
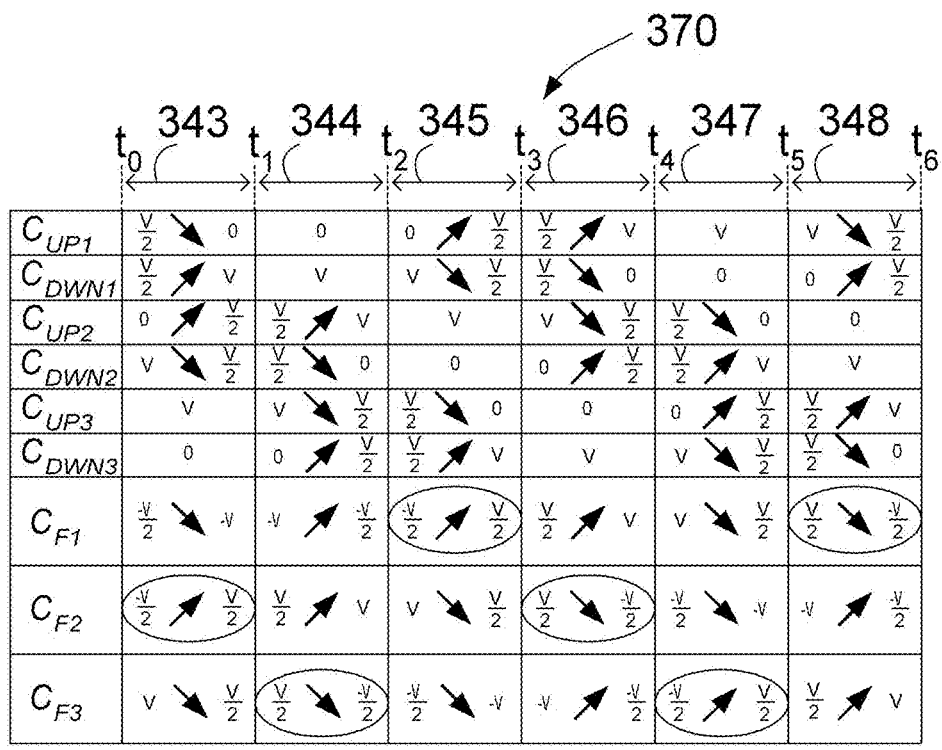
FIG. 3C shows a simplified analysis of charging and discharging of capacitors of the circuit of FIG. 3A.

FIG. 3C shows a simplified analysis in a table format, generally designated 370, of charging and discharging of capacitors of the circuit of FIG. 3A for each time interval 343, 344, 345, 346, 347, and 348. Each column of the table corresponds to one of the timing intervals 343, 344, 345, 346, 347, and 348 of FIG. 3B. Columns are labeled using the same time interval designators 343, 344, 345, 346, 347, and 348.

Capacitor charging is illustrated by a rising diagonal arrow and represents an increase in capacitor voltage measured as positive on the terminal marked with a dot 315 in FIG. 3A. Discharging is illustrated by a falling diagonal arrow and represents a decrease in capacitor voltage measured as positive on the terminal marked with a dot 315 in FIG. 3A. The capacitor voltage before charging or discharging is shown in the left side of the diagonal arrow and the capacitor voltage after charging or discharging is shown in the right side of the diagonal arrow.

It can be noticed by examining FIG. 3C that during each time interval capacitors $C_{UP1}$, $C_{DWN1}$, $C_{UP2}$, $C_{DWN2}$, $C_{UP3}$, $C_{DWN3}$ may either charge or discharge over a V/2 voltage range, or may remain unchanged at 0 or V voltage values.

It can also be noticed by examining FIG. 3C that during each time interval 343, 344, 345, 346, 347, 348 one $C_{UP}$ and one $C_{DWN}$ capacitors charge with V/2 voltage range and one $C_{UP}$ and one $C_{DWN}$ discharge with V/2 voltage range.

Also, during each time interval 343, 344, 345, 346, 347, 348 either two feedback capacitors charge with V/2 voltage range and one feedback capacitor discharges with V voltage range, or two feedback capacitors discharge with V/2 voltage range and one feedback capacitor charges with V voltage range.

During charging and discharging of capacitors, dynamic currents flow in and out the positive power supply node VDD and negative power supply node VSS. The variation in time and magnitude of these dynamic charging and discharging currents depend on the values of capacitors $C_{UP1}$, $C_{DWN1}$, $C_{UP2}$, $C_{DWN2}$, $C_{UP3}$, $C_{DWN3}$, $C_{F1}$, $C_{F2}$, $C_{F3}$, of FIG. 3A and the drain to source resistance of the PMOS and NMOS transistors of FIG. 3A.

With reference to FIG. 3C the circled charging and discharging of feedback capacitors represent the cases when both terminals of the capacitor vary in opposite directions; one terminal has a rising edge and the other terminal has a falling edge. It is significant to note that those skilled in the art will appreciate that due to the Miller theorem the equivalent capacitance in these cases equals twice the capacitance of a feedback capacitor. Therefore, it can be noticed that during each time interval 343, 344, 345, 346, 347, 348 the same value of combined feedback capacitance charges or discharges.

Since during each of the six time intervals of an oscillation period the same number of capacitors charge and the same number of capacitors discharge, it is possible to adjust the charging and discharging parameters so that the total current flowing through the power distribution to be maintained constant.

Therefore, each power supply constant current load of the present invention comprises a ring oscillator circuit of FIG. 3A having transistors' physical dimensions, interconnect wires widths and lengths, physical layout placement of transistors and interconnect wires on the die selected so that the sum of dynamic currents that flow in and out the voltage supplies nodes VDD and VSS does not vary in time, thus consuming a continuous constant power supply current.

A more accurate analysis of ring oscillator functionality involves complex mathematical models of transistors in various operating regions and it becomes apparent to one skilled in the art that such extensive mathematical computations are not suitable for hand calculation. These mathematical models of transistors and extensive mathematical computations are typically solved by numerical methods implemented in software circuit simulation tools.

A ring oscillator that consumes constant power supply currents according to the present invention may have parameters chosen by successive iterations of circuit simulations using a software circuit simulation tool.

Figure 4A:
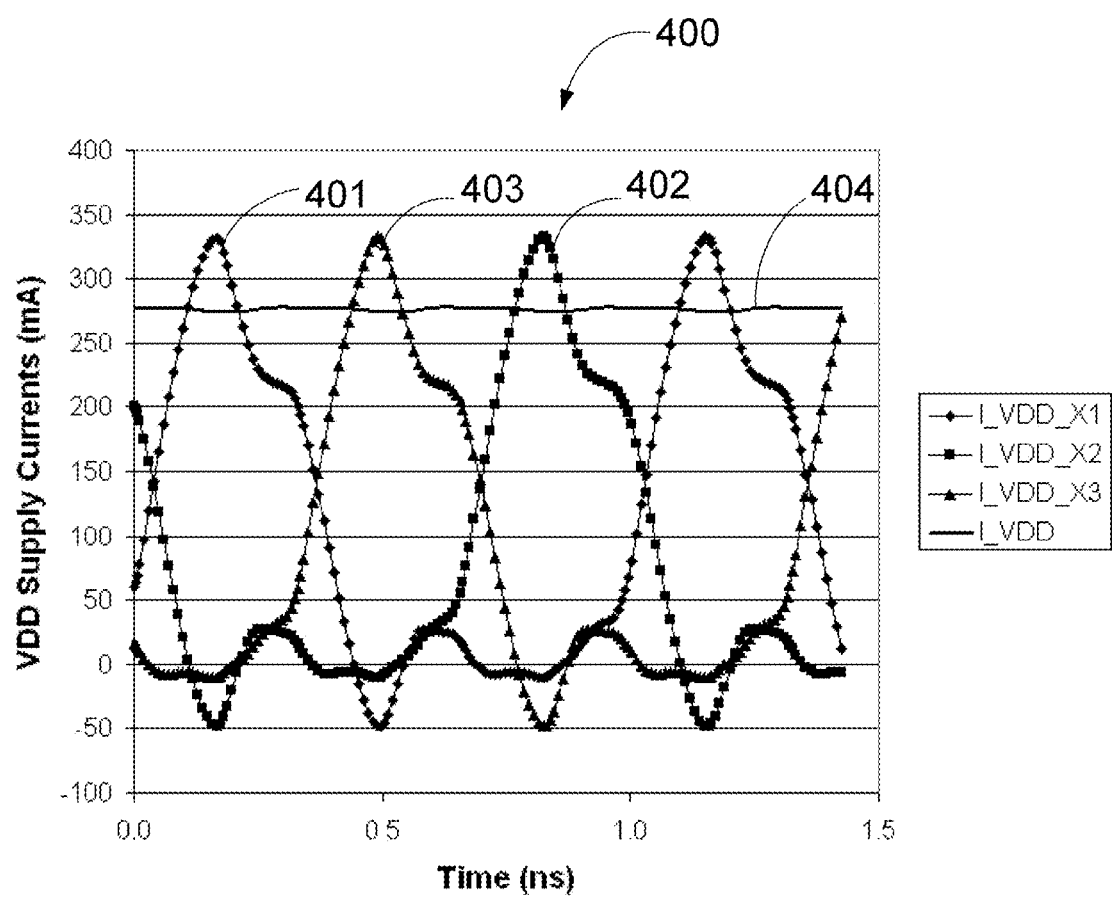
FIG. 4A illustrates simulation results of the electric currents flowing from the positive power supply node VDD of the circuit of FIG. 3A.

FIG. 4A illustrates an example of simulation results, generally designated 400, of the current flowing in and out the positive supply VDD of a ring oscillator circuit of FIG. 3A having the parameters chosen so that the total power supply current stays constant in time. The diamond-symbol marked trace 401 represents the electric current flowing from power supply node VDD into INVERTER1, labeled I_VDD_X1 in FIG. 3A. The square-symbol marked trace 402 represents the electric current flowing from power supply node VDD into INVERTER2, labeled I_VDD_X2 in FIG. 3A. The triangle-symbol marked trace 403 represents the electric current flowing from power supply node VDD into INVERTER3, labeled I_VDD_X3 in FIG. 3A. The solid-line trace 404 represents the total power supply current flowing from voltage supply node VDD into the ring oscillator. It is noticeable that even though each inverter's power supply current varies dynamically by about 350 mA peak-to-peak amplitude, the sum of these three inverters' power supply currents, trace 404, is constant in time within about +/−1% of the magnitude.

Figure 4B:
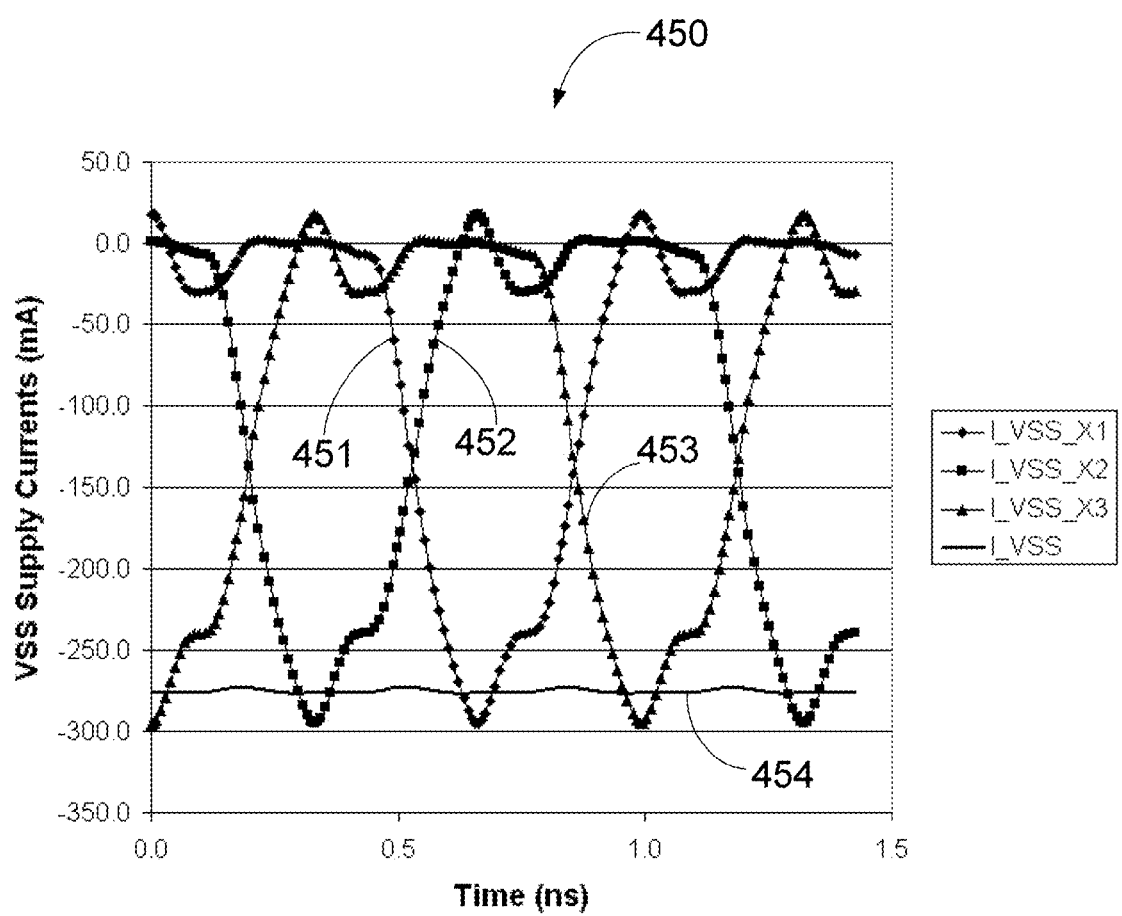
FIG. 4B illustrates simulation results of the electric currents flowing into the negative power supply node VSS of the circuit of FIG. 3A.

FIG. 4B illustrates simulation results in a graphical format, generally designated 450, of the current flowing in and out the negative supply VSS of a ring oscillator circuit of FIG. 3A having the parameters chosen so that the total power supply current stays constant in time. The diamond-symbol marked trace 451 represents the power supply current flowing from power supply node VSS into INVERTER1. The negative sign results form the way the circuit simulation software represents the direction of current flow, as positive if it flows into the inverter and negative if it flows outside the inverter; in this case the current flows from the inverter into the power supply node VSS. The square-symbol marked trace 452 represents the power supply current flowing from power supply node VSS into INVERTER2. The triangle-symbol marked trace 453 represents the power supply current flowing from power supply node VSS into INVERTER3. The solid-line trace 454 represents the total power supply current flowing from voltage supply node VSS into the ring oscillator. It is noticeable that even though each inverter's power supply current varies dynamically by about 300 mA peak-to-peak amplitude, the sum of these three inverters' power supply currents, trace 454, is constant in time within about +/−1% of the magnitude.

As it can be depicted from these simulation results, the dynamic variations of power supplies currents of inverters balance each other and they combine into a continuous constant current consumed from the power supply. Simulation results with a larger number of inverter stages show the same mechanisms of combining all inverters' dynamic power supply currents into a continuous constant power supply current. This balancing of currents can be achieved also in a ring oscillator implemented in a programmable logic device by configuring logic blocks of the programmable logic device. Typical programmable logic devices implement logic gates by configuring digital look-up-table blocks (LUT), which are part of configurable logic blocks (CLB). A digital look-up-table (LUT) can be configured to function as any typical type of digital logic gate or combination of typical digital logic gates.

Figure 5:
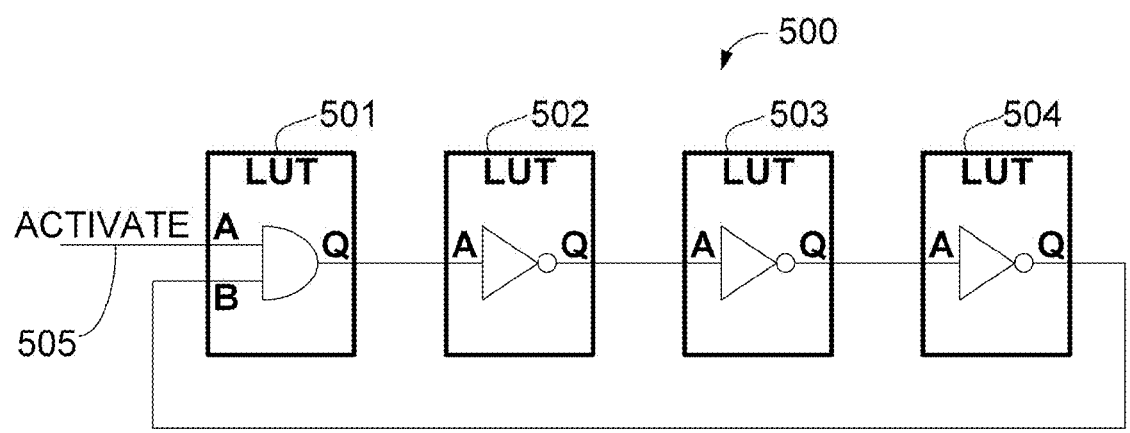
FIG. 5 illustrates a power supply constant current load implemented in a programmable logic device by configuring look-up-table (LUT) logic blocks typically available in any programmable logic device.

FIG. 5 illustrates a power supply constant current load, generally designated 500, implemented in a programmable logic device by configuring look-up-table (LUT) logic blocks of the programmable logic device. Look-up-tables (LUT) are components of configurable logic blocks (CLB) available in any typical programmable logic device (PLD). Look-up-table (LUT) block 501 is configured to function as two-input logic AND gate having two inputs, A, B and an output Q. Look-up-table (LUT) blocks 502, 503, and 504 are configured to function as logic inverter gates. An activate digital logic signal 505 is provided at input A of look-up-table 501. When the activate logic signal 505 is at logic value "true" the output state of the look-up-table block 501 follows the logic state value at input B, forming a positive feedback signal path between the output of inverter 504 and input of inverter 502. This positive feedback path makes the circuit function as a ring oscillator. When the activate signal 505 is switched to logic value "false", the output state of the loop-up-table block 501 is set at logic level "false", disabling the ring oscillator feedback path and stopping the oscillation.

At physical implementation on the die, each configuration of a look-up-table (LUT) connects the electrical signals through different devices and interconnects. Each of these paths has different combinations of load capacitance and feedback capacitance values. Therefore, the types of logic gates configured in look-up-table (LUT) blocks, the physical placement of LUT blocks within the die, and the routing paths of the signals connecting these LUT blocks can be configured to balance the internal load capacitances and feedback capacitances with the transistors' parameters so that the ring oscillator consumes a continuously constant power supply current.

Referring now back to FIG. 2, frequency generator 205 provides a periodic digital signal of a programmed frequency $f_0$ to sinusoidal power supply current load block 203. The sinusoidal power supply current load block 203 is activated by applying a digital logic signal on the activate input 208. While activated, the sinusoidal power supply current load block 203 consumes a continuously sinusoidal current 215. This sinusoidal current load generation is controlled by the trigonometric sine function decoder 211 which activates periodically a plurality of power supply constant current loads 210 so that their combined power supply current gradually increases and decreases following a trigonometric sine or cosine function with a frequency proportional to the frequency of the digital signal received from function generator 205. The amplitude of the generated sinusoidal power supply current is maintained constant over all frequencies. This sinusoidal current 215 flows through the power distribution network 202 and generates a sinusoidal voltage variation of the power supply voltage $V_S$ 209.

When frequency generator 205 is programmed to zero frequency, the sinusoidal power supply current load generates a continuous constant current with the same magnitude as the amplitude of sinusoidal currents for non-zero frequencies. This continuous constant current flows through the power distribution network 202 and generates a continuous constant voltage variation of the power supply voltage $V_S$ 209.

Figure 6:
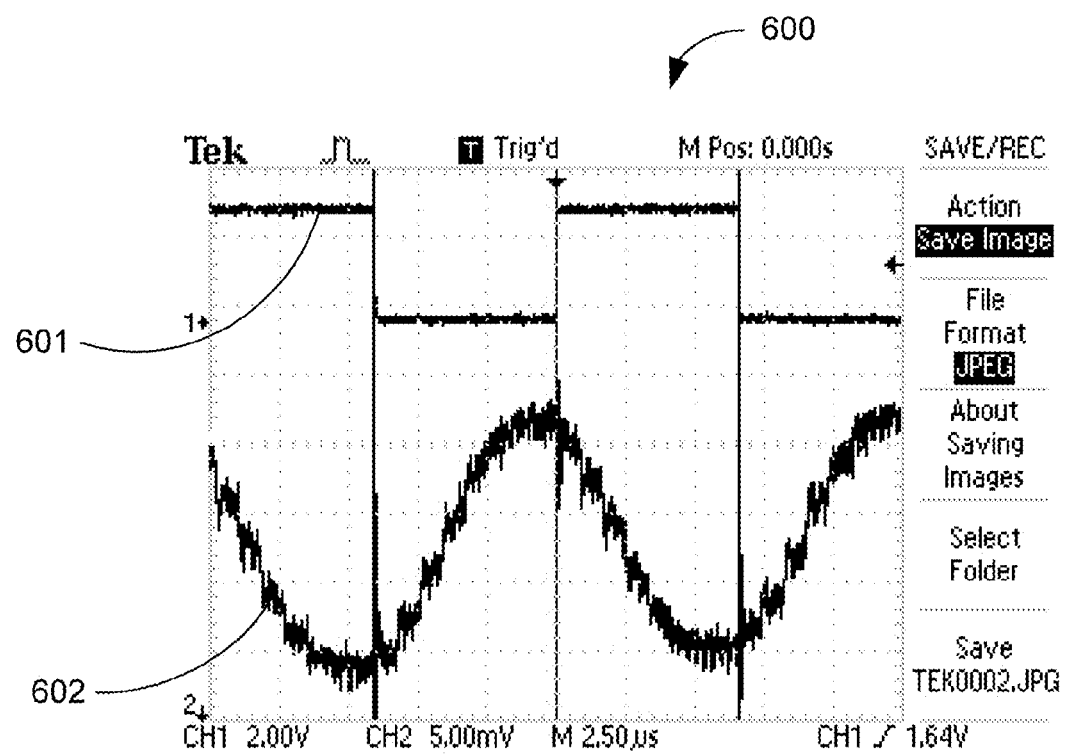
FIG. 6 illustrates an example of measured sinusoidal variation of a power supply voltage of a field programmable gate array (FPGA) programmable logic device using a method of the present invention.

Referring now to FIG. 6, a waveform measurement example, generally designated 600, obtained with an oscilloscope, shows a sinusoidal variation of a power supply voltage of a field programmable gate array (FPGA) generated using a method of the present invention. Waveform 601 represents the signal provided by the frequency generator 205 in FIG. 2. Waveform 602 represents a measured sinusoidal voltage variation generated on the power supply voltage by a method of the current invention. This waveform has been measured at the package pins of the field programmable gate array (FPGA).

In general, the maximum achievable frequency of a sinusoidal power supply current load depends on the characteristics of the programmable logic device, more specifically the maximum frequency of signals that can be processed by configurable logic blocks of the programmable logic device specified by manufacturers. Each type of programmable logic device has a different maximum frequency specification, which may be in the range of 400 MHz-800 MHz. Typically, the maximum frequency of a sinusoidal power supply current load of the present invention is lower than the maximum frequency of signals that can be processed by the configurable logic blocks of a programmable logic device. Therefore, there exists a frequency range above the maximum achievable frequency of a sinusoidal power supply current load and below the maximum frequency of signals that can be processed by the configurable logic blocks. Within this frequency range there is still possible to measure the power distribution impedance by using a rectangular-wave power supply current load.

Turning now the attention to FIG. 2, a rectangular-wave power supply current load can be configured similarly to sinusoidal power supply current load 203 by periodically activating and deactivating a number of constant current loads 210 directly from the output digital signal of the frequency generator 205. For example when frequency generator signal is at logic "true" or "high" a number of power supply constant current loads 210 are activated through the activate feature 212. When the frequency generator signal is at logic "false" or "low" the power supply constant current loads 210 are deactivated. This way a rectangular-wave power supply current load is generated. This rectangular-wave power supply current load has a frequency equal the frequency of the function generator signal. Typical frequency generators can provide digital rectangular-wave signals having frequencies up to the maximum frequency of signals that can be processed by the logic blocks of the programmable logic device specified by manufacturers. Therefore, rectangular-wave power supply current loads can be used to measure the power distribution impedance at frequencies larger than the maximum achievable frequency of a sinusoidal power supply current load. Since typically at these high frequencies the harmonic components above the fundamental frequency of a rectangular-wave signal are low-pass filtered by the semiconductor devices capacitance, most of the signal energy is contained in the fundamental component of the frequency spectrum. This fundamental component is a sinusoidal signal. Therefore, at these high frequencies the power distribution impedance can be calculated with acceptable accuracy by using the same formula for calculating power distribution impedance with the sinusoidal power supply current load 203.

Referring to FIG. 2, ring oscillator 204 comprises configurable logic blocks (CLB) of the programmable logic device (PLD) configured as a positive feedback ring oscillator. This ring oscillator is powered from the same on-die voltage supply as the sinusoidal power supply current load 203. Therefore, the generated sinusoidal variation of power supply voltage 209 is applied also to the power supply of the ring oscillator 204. This sinusoidal variation of the power supply 209 modulates the oscillation frequency of ring oscillator 204.

Figure 7:
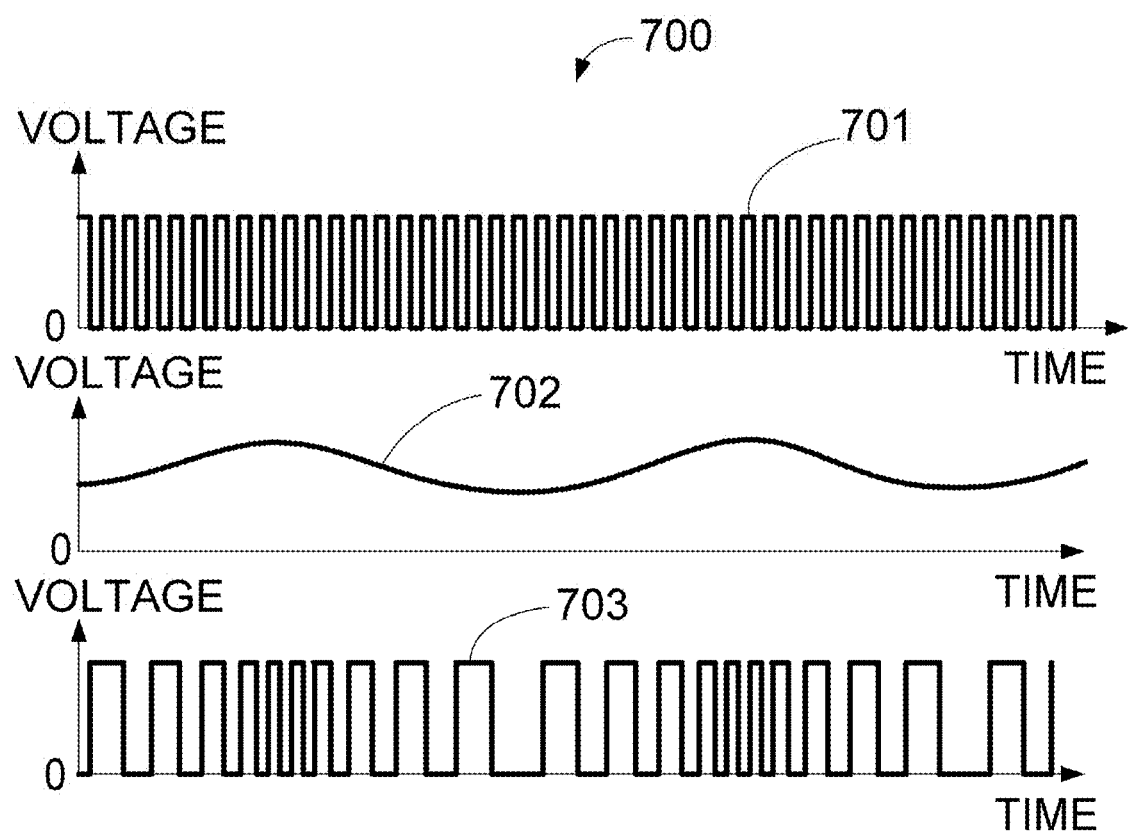
FIG. 7 illustrates an output waveform of a ring oscillator frequency-modulated (FM) by a sinusoidal voltage variation of the voltage supply of the ring oscillator.

FIG. 7 illustrates in a graphical format, generally referenced 700, the frequency modulation of a ring oscillator by a sinusoidal voltage variation of its power supply voltage. A ring oscillator output waveform may have a rectangular waveform like the waveform illustrated by trace 701. A sinusoidal voltage variation of the voltage supply 702 modulates the frequency of the ring oscillator output waveform 701 generating a frequency-modulated digital signal as shown by trace 703.

Referring now back to FIG. 2, the output signal of ring oscillator 204 is applied to frequency counter 206 through electrical connection 214. When the sinusoidal power supply current load 203 is not active, frequency counter 206 measures a first frequency representing the steady-state oscillation frequency of ring oscillator 204. When the sinusoidal power supply current load 203 is active, frequency counter 206 measures a second frequency representing the steady-state average frequency of the frequency-modulated output signal of the ring oscillator 204 over a period of time defined in the frequency counter configuration.

The electrical impedance of the power distribution network 202 can be calculated using a plurality of mathematical equations involving the said measured first frequency, the said measured second frequency, and fabrication characteristics and functional specifications of the programmable logic device. An example of a simplified mathematical calculation is shown by the equation $Z_{PDN}=(((f_1-f_2)/f_1)*V_{SUPPLY})/(I_{F0}-I_0)$, where $Z_{PDN}$ represents the electrical impedance of the power distribution network 202, $f_1$ is the first frequency measured with the sinusoidal power supply current load 203 not active, $f_2$ is the second frequency measured with the sinusoidal power supply current load active, $V_{SUPPLY}$ is the nominal value of the power supply voltage supplied by the power distribution network 202, $I_{F0}$ is the current consumption of the programmable logic device with the frequency of the sinusoidal power supply current load set to zero, and $I_0$ is the current consumption of the programmable logic device with the sinusoidal power supply current load not active.

It is significant to note that this equation is presented by way of example only. Those skilled in the art will appreciate that more advanced equations that take in account specific fabrication and functionality factors of the programmable logic device and power distribution network may be written and used for calculating the power distribution impedance.

Figure 8:
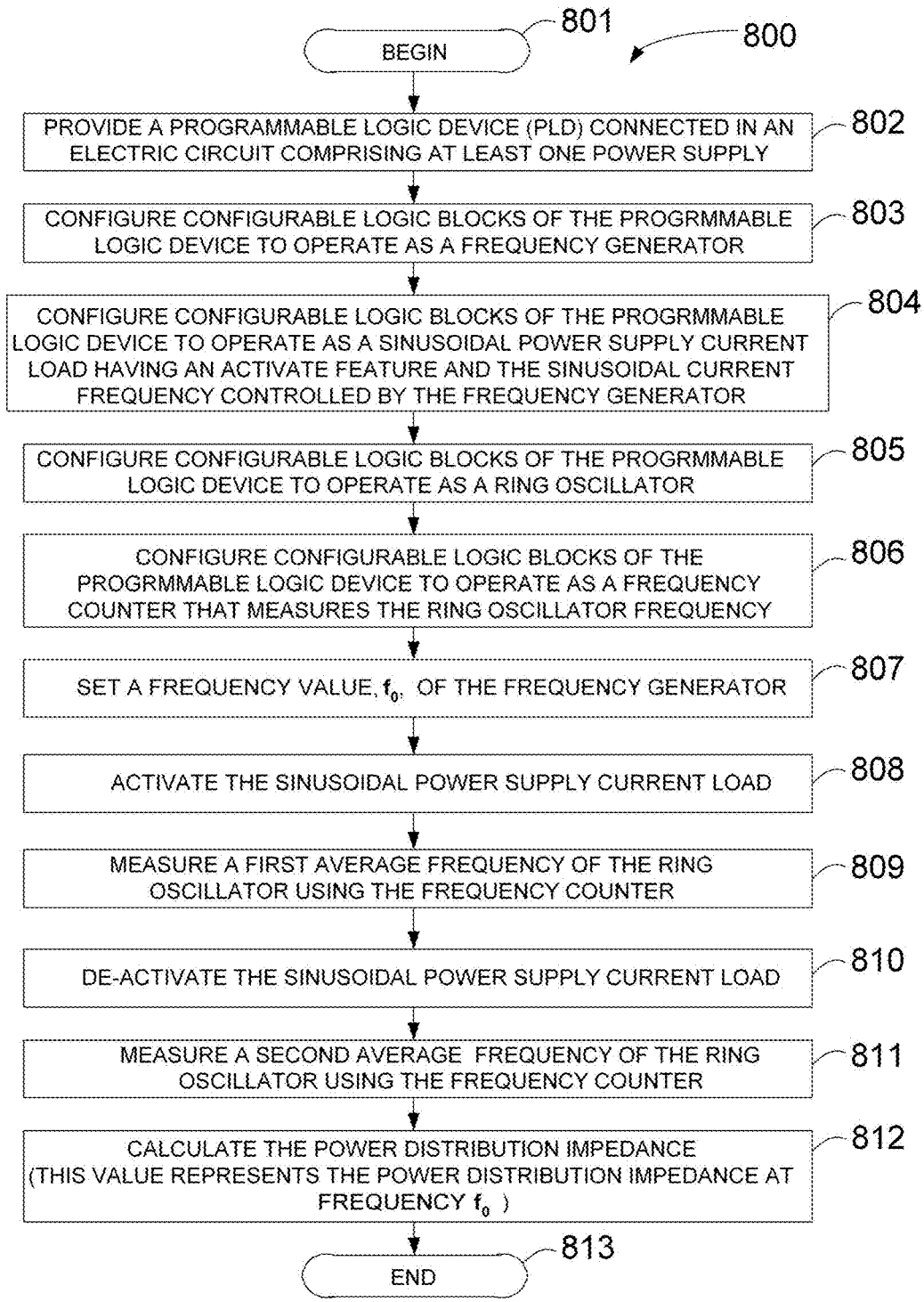
FIG. 8 shows a flowchart of a method of measuring the power distribution impedance of a programmable logic device in accordance with the present invention.

Reference is now directed to FIG. 8, which illustrates a method of configuring a programmable logic device connected to a power distribution network to measure on-die its power distribution network impedance, generally designated 800. In this regard the method of configuring a programmable logic device to measure on-die its power distribution network impedance starts with step 801, herein designated as "Begin". The method of configuring a programmable logic device to measure on-die its power distribution network impedance may provide a programmable logic device (PLD) connected in an electric circuit comprising at least one power supply, as indicated in step 802. Once the programmable logic device is available, a plurality of configurable logic blocks of the programmable logic device may be configured to operate as a frequency generator, as shown in step 803.

The method of configuring a programmable logic device to measure on-die its power distribution network impedance may continue with step 804, where a plurality of configurable logic blocks of the programmable logic device are configured to operate as a sinusoidal power supply current load having an activate feature and having the frequency of the sinusoidal current controlled by the frequency generator of step 803.

The method of configuring a programmable logic device to measure on-die its power distribution network impedance may continue with step 805, where a plurality of configurable logic blocks of the programmable logic device are configured to operate as a ring oscillator. Next, as shown in step 806, a plurality of configurable logic blocks of the programmable logic device are configured to operate as a frequency counter that measures the frequency of the ring oscillator of step 805.

Once the programmable logic device has been configured to have a frequency generator, a sinusoidal power supply current load, a ring oscillator, and a frequency counter, the method of configuring a programmable logic device to measure on-die its power distribution network impedance may proceed to set the frequency generator to provide a signal having a frequency $f_0$, as illustrated in step 807. Since the power distribution impedance depends on frequency, frequency $f_0$ set in the frequency generator is the frequency at which the power distribution impedance is measured.

The method of configuring a programmable logic device to measure on-die its power distribution network impedance may continue with activating the sinusoidal power supply current load, as shown in step 808. Once the sinusoidal power supply current load is active, the method of configuring a programmable logic device to measure on-die its power distribution network impedance proceeds with step 809, in which the frequency counter of step 806 measures a first average frequency of the ring oscillator of step 805.

The method of configuring a programmable logic device to measure on-die power distribution network impedance may continue to de-activate the sinusoidal power supply current load, as shown in step 810. With the sinusoidal power supply current load not active, the method of configuring a programmable logic device to measure on-die its power distribution network impedance may proceed with step 811, in which the frequency counter of step 806 measures a second average frequency of the ring oscillator of step 805.

Once the first and second frequencies have been measured, the method of configuring a programmable logic device to measure on-die its power distribution network impedance may proceed to calculate the power distribution impedance using at least one mathematical equation involving the measured first frequency, the measured second frequency, functional specifications of the programmable logic device, and fabrication characteristics of programmable logic device and power distribution network. The calculated power distribution impedance represents the electrical impedance of the power distribution network at frequency $f_0$ set in step 807.

Steps 807 to 812 may be repeated for multiple frequencies of the frequency generator set in step 807 to calculate the impedance of the power distribution network at multiple frequencies. These calculated values of power distribution impedance at multiple frequencies represent the "frequency characteristic" (or "frequency profile") of the power distribution impedance.

When it is desired to measure the power distribution impedance at frequencies higher than the maximum achievable frequency of generating sinusoidal power supply current load and a rectangular-wave power supply current load is configured in the programmable logic device, steps 807 to 812 may be repeated for multiple frequencies set in step 807 to calculate the impedance of power distribution network at multiple frequencies. In this case steps 808 and 810 activate and deactivate the rectangular-wave power supply current load instead of the sinusoidal power supply current load.

Figure 9:
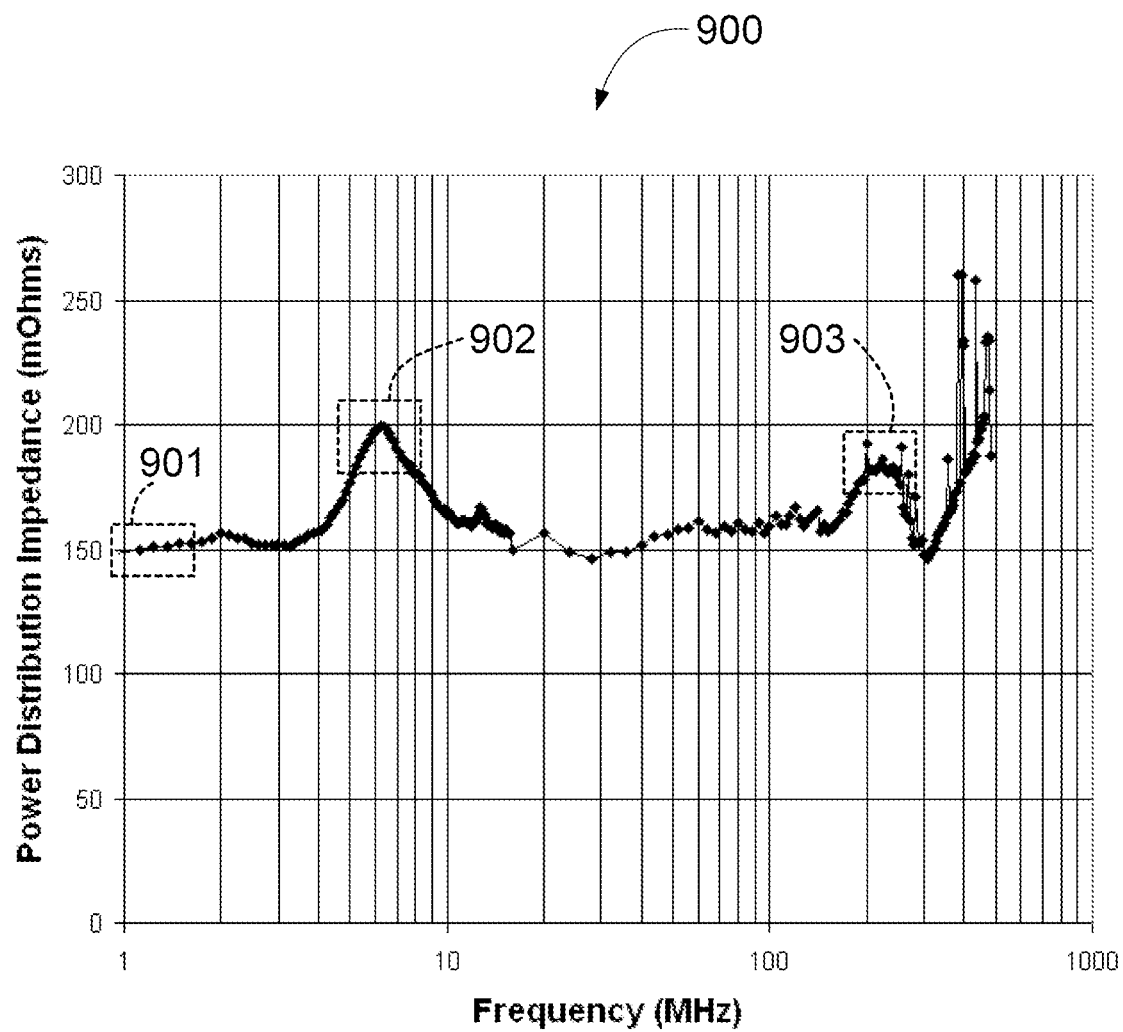
FIG. 9 illustrates an example of frequency characteristic of a power distribution network impedance measured in accordance with the present invention method in a field programmable gate array (FPGA) integrated circuit connected to a power distribution network and part of an electronic system.

FIG. 9 illustrates a frequency characteristic of a power distribution network impedance, generally designated 900, measured using a method of the present invention in a field programmable gate array (FPGA) connected to a power distribution network and part of an electronic system. It can be noticed on this frequency characteristic that the impedance value is about 150 milli-Ohms at a frequency of 1 MHz 901. It can also be noticed that there is a first resonant peak of 200 milli-Ohms at a frequency of about 6.2 MHz 902 and a second resonant peak of 170 milli-Ohms at about 220 MHz 903.

What is claimed is:

1. A method for measuring an electrical impedance of a power distribution network of a programmable logic device die containing a plurality of configurable logic blocks powered from the power distribution network said configurable logic blocks having at least a look-up-table an input pin an output pin a load capacitance and a feedback capacitance, and containing a programmable interconnects network for connecting the configurable logic blocks said programmable interconnects network having wire capacitance, comprising the steps of:
   configuring the programmable logic device die to implement a power supply sinusoidal current load by using the programmable interconnects network to connect input and output pins of a plurality of said configurable logic blocks said power supply sinusoidal current load consuming a sinusoidal current from said power distribution network;
   configuring the programmable logic device die to implement an activate feature for said power supply sinusoidal current load;
   configuring the programmable logic device die to implement a programmable frequency generator coupled to the power supply sinusoidal current load so that the frequency of the power supply sinusoidal current load depends on the frequency of the programmable frequency generator;
   configuring the programmable logic device die to implement a first ring oscillator by using the programmable interconnects network to connect input and output pins of a plurality of the configurable logic blocks said first ring oscillator having a oscillating frequency measurement feature;
   programming a frequency value of the said programmable frequency generator, activating the said power supply sinusoidal current load and measuring a first average frequency of the said first ring oscillator over a time interval, deactivating the said power supply sinusoidal current load and measuring a second average frequency of the said first ring oscillator over a time interval, and calculating the electrical impedance of the said power distribution network at the said frequency value by processing the values of the said first average frequency, the said second average frequency, and a plurality of design and functionality characteristics of the said programmable logic device.

2. The method of claim 1 wherein the power supply sinusoidal current load receives a signal from the said programmable frequency generator and activates periodically a variable number of power supply constant current loads, the said variable number varying periodically proportionally with a sine or a cosine mathematical function and having a frequency dependent on the frequency of the signal received from the programmable frequency generator, thus combining constant currents into a sinusoidal waveform current with waveform aberrations less than 40% through the said power distribution network.

3. The method of claim 2 wherein the power supply constant current load comprises a second ring oscillator made of a plurality of configurable logic blocks and programmable interconnects having the programmable interconnects and the look-up-tables of the configurable logic blocks specified to balance the load capacitance feedback capacitance and wire capacitance so that said second ring oscillator consumes a continuous constant current from said power distribution network during oscillation.

4. The method of claim 3 further comprising the step of:
   repeating the steps of claim 1 for multiple said frequency values programmed in the programmable frequency generator to provide impedance versus frequency information of said power distribution network.

5. The method of claim 4 wherein the programmable logic device die is part of a more complex integrated circuit die.

6. The method of claim 4 further comprising the steps of:
   configuring the programmable logic device die to implement a rectangular-wave power supply current load which receives a signal from the said programmable frequency generator and activates and deactivates periodically at least one said power supply constant current load at a frequency dependent on the frequency of the signal received from the programmable frequency generator, thus generating a rectangular waveform current with waveform aberrations less than 40% through the said power distribution network;
   configuring the programmable logic device die to implement an activate feature for said rectangular-wave power supply current load.

7. The method of claim 6 further comprising the steps of:
   programming a frequency value of the said programmable frequency generator, activating the said rectangular-wave power supply current load and measuring a first average frequency of the said first ring oscillator over a time interval, deactivating the said rectangular-wave power supply current load and measuring a second average frequency of the said first ring oscillator over a time interval, and calculating the electrical impedance of the said power distribution network at the said frequency value by processing the values of the said first average frequency, the said second average frequency, and a plurality of design and functionality characteristics of the said programmable logic device.

8. The method of claim 7 wherein an electronic system such as computer, microprocessor, or microcontroller communicates with the said programmable logic device and controls the frequency generated by the said programmable frequency generator, activates a plurality of said power supply constant current loads, measures a first frequency of the said first ring oscillator, deactivates the said power supply constant current loads, measures a second frequency of the said first ring oscillator, calculates the electrical impedance of said power distribution network, displays the electrical impedance value on a graphical user interface, and saves the electrical impedance value in a memory device.

9. A method for measuring an electrical impedance of a power distribution network of a programmable logic device die containing a plurality of configurable logic blocks powered from a first power distribution network said configurable logic blocks having at least a look-up-table an input pin an output pin load capacitance and feedback capacitance, containing a plurality of input-output blocks powered from a second power distribution network said input-output blocks having at least an input pin an output pin load capacitance and feedback capacitance, and containing a programmable interconnects network for connecting the configurable logic blocks and the input-output blocks said programmable interconnects network having wire capacitance, comprising the steps of:

configuring the programmable logic device die to implement a power supply sinusoidal current load by using the programmable interconnects network to connect input and output pins of a plurality of said input-output blocks and a plurality of said configurable logic blocks said power supply sinusoidal current load consuming a sinusoidal current from said second power distribution network;

configuring the programmable logic device die to implement an activate feature for said power supply sinusoidal current load;

configuring the programmable logic device die to implement a programmable frequency generator coupled to the power supply sinusoidal current load so that the frequency of the power supply sinusoidal current load depends on the frequency of the programmable frequency generator;

configuring the programmable logic device die to implement a first ring oscillator by using the programmable interconnects network to connect input and output pins of a plurality of the input-output blocks and a plurality of the configurable logic blocks said first ring oscillator having a oscillating frequency measurement feature;

programming a frequency value of the said programmable frequency generator, activating the said power supply sinusoidal current load and measuring a first average frequency of the said first ring oscillator over a time interval, deactivating the said power supply sinusoidal current load and measuring a second average frequency of the said first ring oscillator over a time interval, and calculating the electrical impedance of the said second power distribution network at the said frequency value by processing the values of the said first average frequency, the said second average frequency, and a plurality of design and functionality characteristics of the said programmable logic device.

10. The method of claim 9 wherein the power supply sinusoidal current load receives a signal from the said programmable frequency generator and activates periodically a variable number of power supply constant current loads, the said variable number varying periodically proportionally with a sine or a cosine mathematical function and having a frequency dependent on the frequency of the signal received from the programmable frequency generator, thus combining constant currents into a sinusoidal waveform current with waveform aberrations less than 40% through the said second power distribution network.

11. The method of claim 10 wherein the power supply constant current load comprises a second ring oscillator made of a plurality of input-output blocks, a plurality of configurable logic blocks, programmable interconnects, and having the programmable interconnects and the look-up-tables of the configurable logic blocks specified to balance the load capacitance feedback capacitance and wire capacitance so that said second ring oscillator consumes a continuous constant current from the second power distribution network during oscillation.

12. The method of claim 11 further comprising the step of:
repeating the steps of claim 9 for multiple said frequency values programmed in the programmable frequency generator to provide impedance versus frequency information of said second power distribution network.

13. The method of claim 12 further comprising the steps of:
configuring the programmable logic device die to implement a rectangular-wave power supply current load which receives a signal from the said programmable frequency generator and activates and deactivates periodically at least one said power supply constant current load at a frequency dependent on the frequency of the signal received from the programmable frequency generator, thus generating a rectangular waveform current with waveform aberrations less than 40% through the said second power distribution network;

configuring the programmable logic device die to implement an activate feature for said rectangular-wave power supply current load.

14. The method of claim 13 further comprising the steps of:
programming a frequency value of the said programmable frequency generator, activating the said rectangular-wave power supply current load and measuring a first average frequency of the said first ring oscillator over a time interval, deactivating the said rectangular-wave power supply current load and measuring a second average frequency of the said first ring oscillator over a time interval, and calculating the electrical impedance of the said second power distribution network at the said frequency value by processing the values of the said first average frequency, the said second average frequency, and a plurality of design and functionality characteristics of the said programmable logic device.

15. The method of claim 14 wherein the programmable logic device die is part of a more complex integrated circuit die.

* * * * *